(12) United States Patent
Zhou

(10) Patent No.: US 10,483,263 B2
(45) Date of Patent: Nov. 19, 2019

(54) SEMICONDUCTOR DEVICE AND MANUFACTURING METHOD THEREFOR

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corp., Shanghai (CN); Semiconductor Manfacturing International (Beijing) Corp., Beijing (CN)

( * ) Notice: Subject to any disclaimer, the term of this patent is extended or adjusted under 35 U.S.C. 154(b) by 0 days.

(21) Appl. No.: 15/603,754

(22) Filed: May 24, 2017

(65) Prior Publication Data

US 2017/0352663 A1 Dec. 7, 2017

(30) Foreign Application Priority Data

Jun. 1, 2016 (CN) .......................... 2016 1 0379168

(51) Int. Cl.
*H01L 27/00* (2006.01)
*H01L 27/092* (2006.01)
(Continued)

(52) U.S. Cl.
CPC ...... *H01L 27/0924* (2013.01); *H01L 21/0332* (2013.01); *H01L 21/0337* (2013.01);
(Continued)

(58) Field of Classification Search
CPC ................ H01L 21/823431; H01L 21/823462
See application file for complete search history.

(56) References Cited

U.S. PATENT DOCUMENTS 8,765,546 B1 * 7/2014 Hung .............. H01L 21/823431
257/190
9,735,047 B1 * 8/2017 Chang ................. H01L 21/7682
(Continued)

FOREIGN PATENT DOCUMENTS

| CN | 1959959 A | 5/2007 |
| CN | 101364545 | 2/2009 |
| CN | 106876335 A * | 6/2017 |

OTHER PUBLICATIONS

European Search Report for corresponding European Application No. 17173729.9 dated Oct. 9, 2017.

*Primary Examiner* — Fernando L Toledo
*Assistant Examiner* — Valerie N Newton
(74) *Attorney, Agent, or Firm* — Brinks Gilson & Lione

(57) ABSTRACT

The present disclosure provides a semiconductor device and a manufacturing method therefor. The device may include: a semiconductor substrate; a fin projecting from the semiconductor substrate, where trenches are formed on sides of the fin; a first insulator layer partially filling the trenches, where the fin protrudes from the first insulator layer; a second insulator layer covering the fin; a plurality of pseudo gate structures on the second insulator layer, where each pseudo gate structure wraps a part of the fin, where each pseudo gate structure includes a pseudo gate located on the second insulator layer, the plurality of pseudo gate structures includes at least a first pseudo gate structure and a second pseudo gate structure that are spaced from each other, the second pseudo gate structure is located at an edge corner of the fin, and a part of the second pseudo gate structure is on the first insulator layer; spacers, on the first insulator layer and the second insulator layer, at two sides of each of the plurality of pseudo gate structures; and a source or a drain located among the plurality of pseudo gate structures. The present invention can improve reliability of the device.

19 Claims, 13 Drawing Sheets

(51) Int. Cl.
*H01L 21/033* (2006.01)
*H01L 21/311* (2006.01)
*H01L 21/8238* (2006.01)
*H01L 29/06* (2006.01)
*H01L 29/16* (2006.01)
*H01L 29/161* (2006.01)
*H01L 29/165* (2006.01)
*H01L 29/66* (2006.01)
*H01L 29/78* (2006.01)
H01L 21/28 (2006.01)
H01L 29/49 (2006.01)

(52) U.S. Cl.
CPC ... *H01L 21/31111* (2013.01); *H01L 21/31144* (2013.01); *H01L 21/823814* (2013.01); *H01L 21/823821* (2013.01); *H01L 21/823828* (2013.01); *H01L 27/0922* (2013.01); *H01L 29/0649* (2013.01); *H01L 29/161* (2013.01); *H01L 29/165* (2013.01); *H01L 29/1608* (2013.01); *H01L 29/66636* (2013.01); *H01L 29/66795* (2013.01); *H01L 29/785* (2013.01); *H01L 29/7848* (2013.01); H01L 21/28035 (2013.01); H01L 29/4916 (2013.01)

(56) References Cited

U.S. PATENT DOCUMENTS

| | | |
|---|---|---|
| 2014/0252479 A1 | 9/2014 | Utomo et al. |
| 2016/0104673 A1 | 4/2016 | Tung |
| 2016/0260833 A1* | 9/2016 | Basker ............... H01L 29/7853 |
| 2017/0141106 A1* | 5/2017 | Chang ............ H01L 21/823462 |
| 2017/0154823 A1* | 6/2017 | Tseng ................ H01L 21/0228 |

* cited by examiner

SEMICONDUCTOR DEVICE AND MANUFACTURING METHOD THEREFOR

CROSS-REFERENCE TO RELATED APPLICATION

This application is based on and claims priority to Chinese patent Application CN201610379168.7, filed Jun. 1, 2016, the entire content of which is incorporated herein by reference.

BACKGROUND

Technical Field

The present disclosure relates to the technical field of semiconductors, and in particular, to a semiconductor device and a manufacturing method therefor.

Related Art

A Fin Field Effect Transistor (FinFET) device is capable of improving performance of a device, reducing a supply voltage, and significantly reducing short-channel effects. However, some problems may occur during an existing method for manufacturing a FinFET device. For example, a source and a drain are needed in an N metal oxide semiconductor (NMOS) transistor and a P metal oxide semiconductor (PMOS) transistor. However, a source and a drain formed on a fin through an epitaxial process may be irregular, which influences performance and uniformity of a device.

There are two designs in the prior art, respectively referred to in FIG. 1A and FIG. 1B. However, there may be some problems for the two designs, separately.

For the design shown in FIG. 1A, three pseudo gates are formed on each of two fins that are isolated by a trench. For example, three pseudo gates 11, 12, and 13 are formed on the left fin. If drifting of a pseudo gate relative to an active region occurs in a manufacturing process of a device (for example, in FIG. 1A, the three pseudo gates on the left fin drift leftwards relative to the active region below and the three pseudo gate on the right fin drift rightwards relative to the active region below, or a key dimension of a pseudo gate may also change), a result of an undesired source or drain formed at peripheries of the fins may be probably caused. For example, a source (or drain) 14 on the left fin and a drain (or source) 15 on the right fin, as shown in FIG. 1A, may be caused In an epitaxial process, the source (or drain) 14 may be connected to the drain (or source) 15, thereby reducing performance of the device.

For the design shown in FIG. 1B, pseudo gates 22 and 23 are formed on a left fin and a right fin, respectively, and a pseudo gate 21 is formed on an insulator 26 for filling a trench between the two fins. During epitaxial growth of a source or a drain, the epitaxial growth of a source and a drain at peripheries of the fins in contact with the insulator 26 may be constrained, so as to cause an irregular appearance of source (or drain) 24 on the left fin or a drain (or source) 25 on the right fin, as shown in FIG. 1B, thereby influencing performance of the device.

SUMMARY

The problems in the prior art have been found by the inventors of the present disclosure and a novel technical solution is provided with respect to at least one of the above problems.

One of the objectives of forms of the present disclosure is: providing a manufacturing method for a semiconductor device. One of the objectives of forms of the present disclosure is: providing a semiconductor device. Forms of the present disclosure can prevent a source (or drain) on a fin from being undesirably connected to a source (or drain) on another fin.

A first aspect of forms of the present disclosure provides a manufacturing method for a semiconductor device, including: providing a substrate structure, where the substrate structure includes: a semiconductor substrate; a fin protruding from the semiconductor substrate, where trenches are formed on the sides of the fin; a first insulator layer partially filling the trenches, where the fin protrudes from the first insulator layer; and a second insulator layer covering the fin.

The forms of the method may further include forming a plurality of pseudo gate structures on the second insulator layer, where each pseudo gate structure wraps a part of the fin, where the pseudo gate structure includes a pseudo gate located on the second insulator layer, and the plurality of pseudo gate structures includes at least a first pseudo gate structure and a second pseudo gate structure that are spaced from each other; and the second pseudo gate structure is located at an edge corner of the fin, and a part of the second pseudo gate structure is on the first insulator layer.

The forms of the method may further include forming, on the first insulator layer and the second insulator layer, spacers at two sides of each of the plurality of pseudo gate structures; etching the second insulator layer and at least a part of the fin that are not covered by the spacers and the pseudo gates, to form a recess in the fin; and forming a source or a drain in the recess.

In some forms, the plurality of pseudo gate structures further includes a third pseudo gate structure spaced from the first pseudo gate structure, where the second pseudo gate structure and the third pseudo gate structure are located at two sides of the first pseudo gate structure, respectively; and the third pseudo gate structure is located at an edge corner of the fin, and a part of the third pseudo gate structure is on the first insulator layer.

In some forms, the step of forming a recess includes: forming, in the fin, a first recess located between the first pseudo gate structure and the second pseudo gate structure and a second recess located between the first pseudo gate structure and the third pseudo gate structure through the etching.

In some forms, the step of forming a source or a drain in the recess includes: forming a source in the first recess and forming a drain in the second recess.

In some forms, the material of the pseudo gate includes polysilicon.

In some forms, the pseudo gate structure further includes a hard mask layer located on the pseudo gate.

In some forms, the material of the hard mask layer includes silicon nitride.

In some forms, the second pseudo gate structure is spaced from the first pseudo gate structure for a first distance, where the first distance ranges from 60 nm to 100 nm.

In some forms, the third pseudo gate structure is spaced from the first pseudo gate structure for a second distance, where the second distance ranges from 60 nm to 100 nm.

In some forms, the manufacturing method further includes: forming an interlayer dielectric layer to cover the substrate structure after the source or the drain is formed; etching back the interlayer dielectric layer, to expose an upper surface of the hard mask layer; removing the hard mask layer, the pseudo gate, and a part of the second insulator layer, so as to form an opening; and forming a gate structure in the opening.

In some forms, the gate structure includes: a gate insulator layer that is on the fin and wraps a part of the fin, and a gate on the gate insulator layer.

In some forms, the fin is an N-well region, and the material of the source or the drain includes silicon germanium; or the fin is a P-well region, and the material of the source or the drain includes silicon carbide.

In some forms, the substrate structure includes multiple fins, including a first fin for forming a PMOS device and a second fin for forming an NMOS device, where the material of the source or the drain on the first fin includes silicon germanium; and the material of the source or the drain on the second fin includes silicon carbide.

A second aspect of forms of the present disclosure provide a semiconductor device, including: a semiconductor substrate; a fin protruding from the semiconductor substrate, where trenches are formed on the sides of the fin; a first insulator layer partially filling the trenches, where the fin protrudes from the first insulator layer; a second insulator layer covering the fin; a plurality of pseudo gate structures on the second insulator layer, where each pseudo gate structure wraps a part of the fin, where the pseudo gate structure includes a pseudo gate located on the second insulator layer, and the plurality of pseudo gate structures includes at least a first pseudo gate structure and a second pseudo gate structure that are spaced from each other; and the second pseudo gate structure is located at an edge corner of the fin, and a part of the second pseudo gate structure is on the first insulator layer; spacers, on the first insulator layer and the second insulator layer, at two sides of each of the plurality of pseudo gate structures; and a source or a drain on the fin and located among the plurality of pseudo gate structures.

In some forms, the plurality of pseudo gate structures further includes a third pseudo gate structure spaced from the first pseudo gate structure, where the second pseudo gate structure and the third pseudo gate structure are located at two sides of the first pseudo gate structure, respectively; and the third pseudo gate structure is located at an edge corner of the fin, and a part of the third pseudo gate structure is on the first insulator layer.

In some forms, the material of the pseudo gate includes polysilicon.

In some forms, the pseudo gate structure further includes a hard mask layer located on the pseudo gate.

In some forms, the material of the hard mask layer includes silicon nitride.

In some forms, the second pseudo gate structure is spaced from the first pseudo gate structure for a first distance, where the first distance ranges from 60 nm to 100 nm.

In some forms, the third pseudo gate structure is spaced from the first pseudo gate structure for a second distance, where the second distance ranges from 60 nm to 100 nm.

In some forms, the source includes a source between the first pseudo gate structure and the second pseudo gate structure; and the drain includes a drain located between the first pseudo gate structure and the third pseudo gate structure.

In some forms, the fin is an N-well region, and the material of the source or the drain includes silicon germanium; or the fin is a P-well region, and the material of the source or the drain includes silicon carbide.

In some forms, the semiconductor device includes multiple fins, including a first fin for forming a PMOS device and a second fin for forming an NMOS device, where the material of the source or the drain on the first fin includes silicon germanium; and the material of the source or the drain on the second fin includes silicon carbide.

Forms of the present disclosure can prevent a source (or drain) on a fin from being undesirably connected to a source (or drain) on another fin, thereby being capable of improving reliability of the device. Forms of the present disclosure can also enable a formed source and drain to have a regular appearance, thereby being capable of improving performance of the device.

Other features and advantages of the present disclosure become clear by describing exemplary forms of the present disclosure in detail with reference to the accompanying drawings below.

BRIEF DESCRIPTION OF THE DRAWINGS

The accompanying drawings that constitute a part of the specification describe forms of the present disclosure, and together with the specification, are used to interpret the present disclosure.

The present disclosure can be understood more clearly according to the detailed description below with reference to the accompanying drawings, where.

DETAILED DESCRIPTION

The present disclosure is described in detail with reference to the accompanying drawings and various exemplary forms. It should be noted that: unless otherwise specified, the relative arrangements of the components and steps, numeral expressions, and values stated in these forms are not intended to limit the scope of the present disclosure.

Meanwhile, it should be understood that the sizes of the respective sections shown in the accompanying drawings are not drawn according to an actual proportion, so as to facilitate the description.

The description of at least one exemplary form below is illustrative only and should not be taken as any limitation to the present disclosure and application or use thereof.

The technology, methods, and devices that are known by a person of ordinary skill in the art are not discussed in detail, and in a proper situation, the technology, methods, and devices should be regarded as parts of the specification.

Any specific values in all the examples shown and discussed herein should be understood as examples only, instead of limitations. Therefore, the other examples of the exemplary forms may have different values.

It should be noted that: similar reference labels and letters in the following accompanying drawings indicate similar items. Therefore, once a certain item is defined in one accompanying drawing, the item needs not to be further discussed in the subsequent accompanying drawings.

Figure 1A:
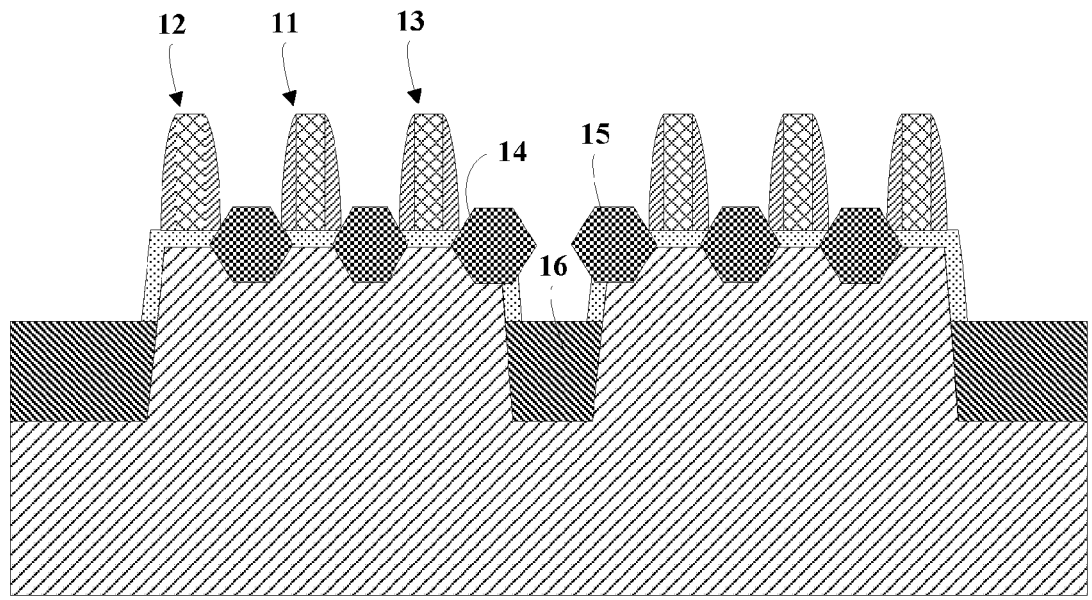
FIG. 1A schematically illustrates a structural schematic diagram of a cross section of a semiconductor device according to an embodiment of the prior art.
Figure 1B:
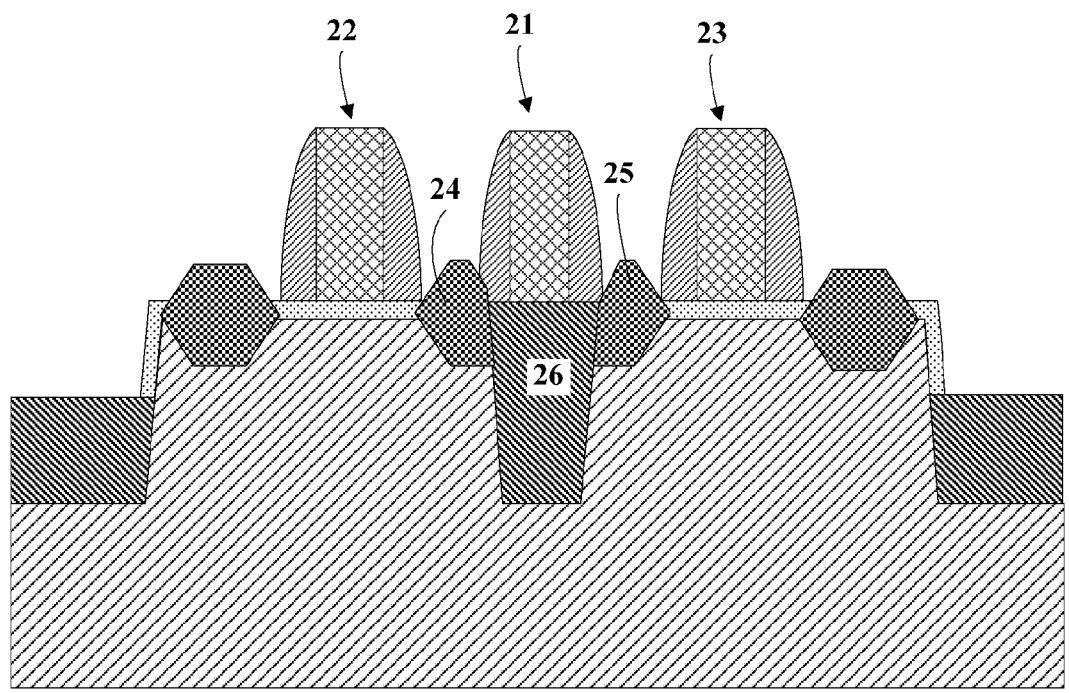
FIG. 1B schematically illustrates a structural schematic diagram of a cross section of a semiconductor device according to another embodiment of the prior art.
Figure 2:
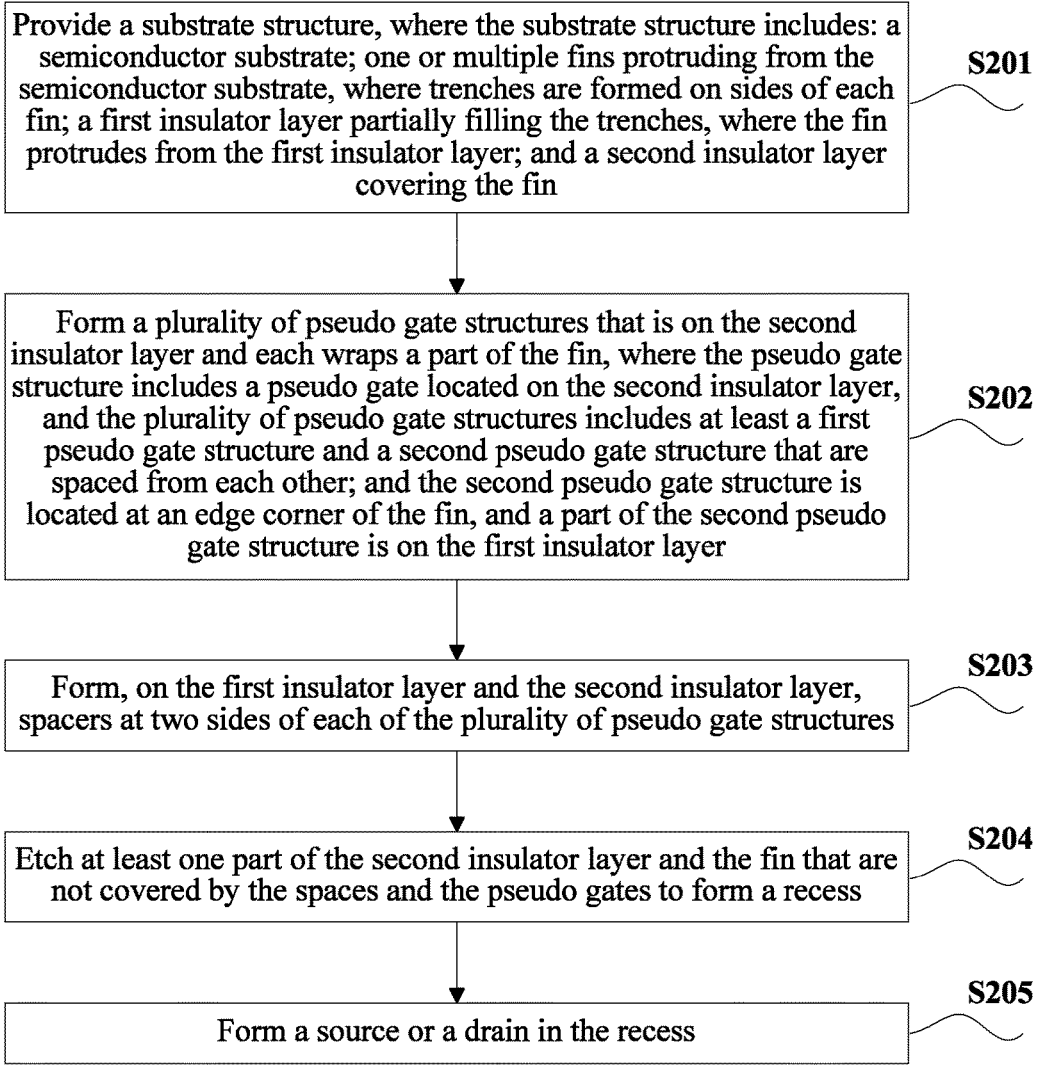
FIG. 2 is a flow chart of a manufacturing method for a semiconductor device.

FIG. 2 is a flow chart of a manufacturing method for a semiconductor device. FIG. 3 to FIG. 12 schematically illustrate structural schematic diagrams of cross sections in several phases of the manufacturing process for a semiconductor device. Some forms of a manufacturing process of a semiconductor device are described in detail below with reference to FIG. 2 and FIG. 3 to FIG. 12.

As shown in FIG. 2, in step S201, a substrate structure is provided.

Figure 3:
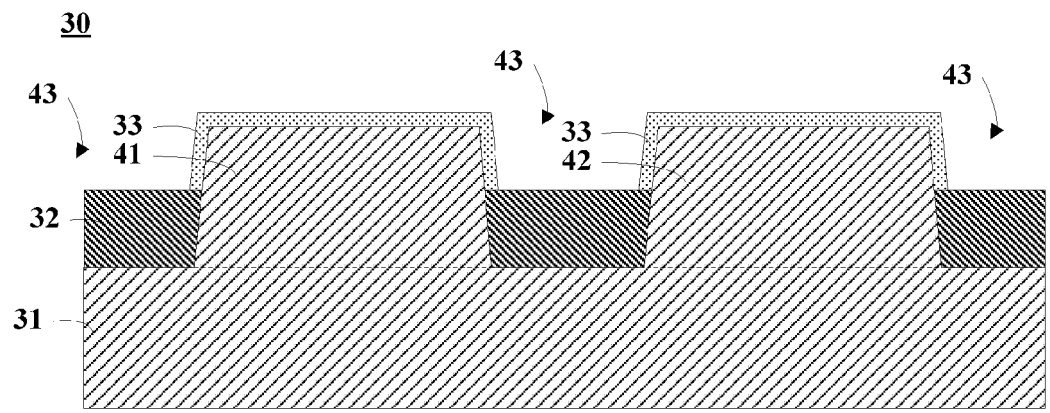
FIG. 3 schematically illustrates a structural schematic diagram of a cross section in a phase of the manufacturing process for a semiconductor device.

FIG. 3 schematically illustrates a structural schematic diagram of a cross section of step S201. As shown in FIG. 3, a substrate structure 30 is provided. The substrate structure 30 may include a semiconductor substrate 31. The semiconductor substrate may be, for example, a silicon substrate. The substrate structure 30 may further include one or multiple fins (for example, a first fin 41 and a second fin 42 shown in FIG. 3) protruding from the semiconductor substrate 31. Trenches 43 are formed on sides of each fin. The fin is a semiconductor fin. For example, the material of the fin may include silicon. The substrate structure 30 may further include a first insulator layer 32 partially filling the trenches 43. The fin protrudes from the first insulator layer 32. The material of the first insulator layer may include silicon dioxide, for example. The substrate structure 30 may further include a second insulator layer 33 covering the fins. The material of the second insulator layer may include silicon dioxide, for example.

It should be noted that: although FIG. 3 shows two fins, a person skilled in the art should understand that fins with a quantity larger than or less than two may be formed on the semiconductor substrate 31, and therefore the scope of the present disclosure is not limited thereto.

In some forms, the fin may be an N-well region or a P-well region. For example, the first fin 41 and the second fin 42 may both be N-well regions or may both be P-well regions, or one of the first fin 41 and the second fin 42 is an N-well region and the other one is a P-well region.

Referring to FIG. 2, in step S202, a plurality of pseudo gate structures that is on the second insulator layer is formed, where each pseudo gate structure wraps a part of a fin.

Figure 4:
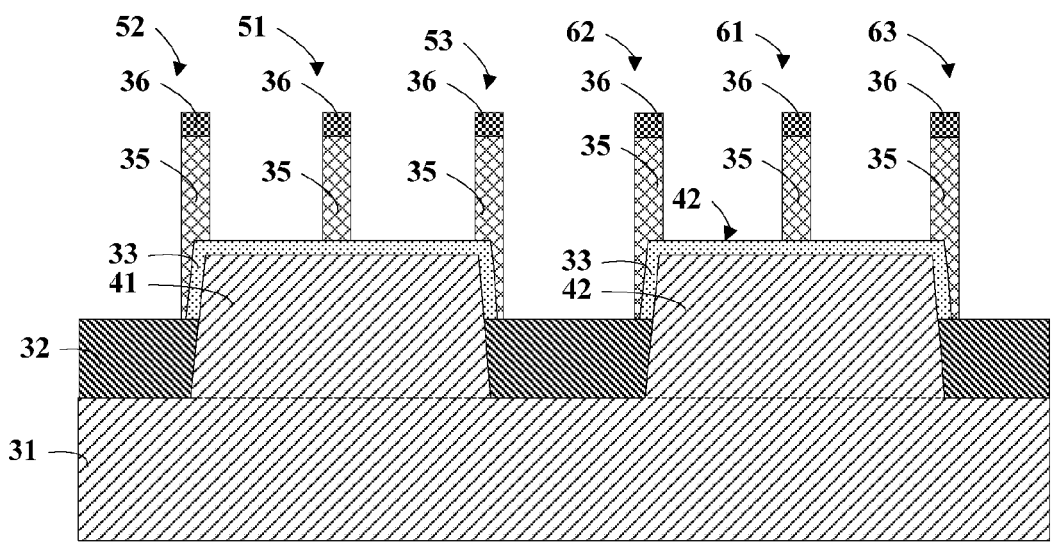
FIG. 4 schematically illustrates a structural schematic diagram of a cross section in a phase of the manufacturing process for a semiconductor device.

FIG. 4 schematically illustrates a structural schematic diagram of a cross section of step S202. As shown in FIG. 4, a plurality of pseudo gate structures is formed on the second insulator layer 33, and each pseudo gate structure wraps a part of a fin. The pseudo gate structure may include a pseudo gate 35 located on the second insulator layer 33. The material of the pseudo gate may include polysilicon, for example. Optionally, the pseudo gate structure may further include a hard mask layer 36 located on the pseudo gate 35. The material of the hard mask layer may include silicon nitride, for example.

In some forms, the plurality of pseudo gate structures includes at least a first pseudo gate structure and a second pseudo gate structure that are spaced from each other. For example, as shown in FIG. 4, on the first fin 41, the plurality of pseudo gate structures includes at least a first pseudo gate structure 51 and a second pseudo gate structure 52 that are spaced from each other. For another example, as shown in FIG. 4, on the second fin 42, the plurality of pseudo gate structures includes at least a first pseudo gate structure 61 and a second pseudo gate structure 62 that are spaced from each other.

In some forms, the second pseudo gate structure is located at an edge corner of a fin and a part of the second pseudo gate structure is located on the first insulator layer. For example, as shown in FIG. 4, the second pseudo gate structure 52 is located at an edge corner of a fin (for example, the first fin 41) and a part of the second pseudo gate structure 52 is located on the first insulator layer 32.

In some forms, the plurality of pseudo gate structures may further include a third pseudo gate structure spaced from the first pseudo gate structure. For example, as shown in FIG. 4, on the first fin 41, the plurality of pseudo gate structures may further include a third pseudo gate structure 53 spaced from the first pseudo gate structure 51. For another example, as shown in FIG. 4, on the second fin 42, the plurality of pseudo gate structures may further include a third pseudo gate structure 63 spaced from the first pseudo gate structure 61. By using the plurality of pseudo gate structures on the first fin 41 as an example, the second pseudo gate structure 52 and the third pseudo gate structure 53 are located at two sides of the first pseudo gate structure 51, respectively, the third pseudo gate structure 53 is located at an edge corner of a fin (for example, the first fin 41), and a part of the third pseudo gate structure 53 is located on the first insulator layer 32.

It should be noted that the first pseudo gate structure 51, the second pseudo gate structure 52, and the third pseudo gate structure 53 on the first fin 41 are used as main objects to be described in the present invention. However, a person skilled in the art should understand that: descriptions of the second pseudo gate structure 52, and the third pseudo gate structure 53 on the first fin 41 (for example, descriptions associated with structures, appearances, and executed processing operations) may also be equally or similarly applicable to descriptions of the first pseudo gate structure 61, the second pseudo gate structure 62, and the third pseudo gate structure 63 on the second fin 42.

In some forms, the second pseudo gate structure (for example, the second pseudo gate structure 52) is spaced from the first pseudo gate structure (for example, the first pseudo gate structure 51) for a first distance. In some embodiments, the first distance may range from 60 nm to 100 nm, for example, 70 nm, 80 nm, or 90 nm.

In some forms, the third pseudo gate structure (for example, the third pseudo gate structure 53) is spaced from the first pseudo gate structure (for example, the first pseudo gate structure 51) for a second distance. In some forms, the second distance may range from 60 nm to 100 nm, for example, 70 nm, 80 nm, or 90 nm.

Figure 12:
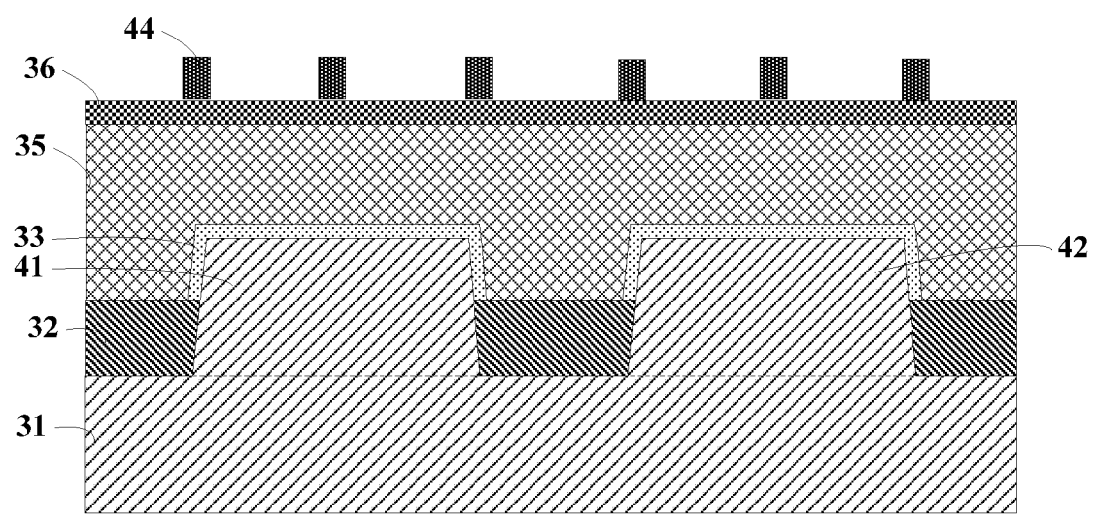
FIG. 12 schematically illustrates a structural schematic diagram of a cross section in a phase of the manufacturing process for a semiconductor device.

In some forms, the step of forming the plurality of pseudo gate structures may include: for example, as shown in FIG. 12, forming a pseudo gate material layer 35 on the substrate structure through a deposition process for example, forming a hard mask layer 36 on the pseudo gate material layer 35 through a deposition process for example, and forming a first patterned mask layer (for example, a photoresist) 44 on the hard mask layer 36 through a coating process for example. Optionally, the first mask layer 44 is used as an etching barrier layer to etch the hard mask layer 36 and the pseudo gate material layer 35, and then the first mask layer 44 is removed to form the structure shown in FIG. 4.

Referring to FIG. 2, in step S203, spacers are formed at two sides of each of the plurality of pseudo gate structures on the first insulator layer and the second insulator layer.

Figure 5:
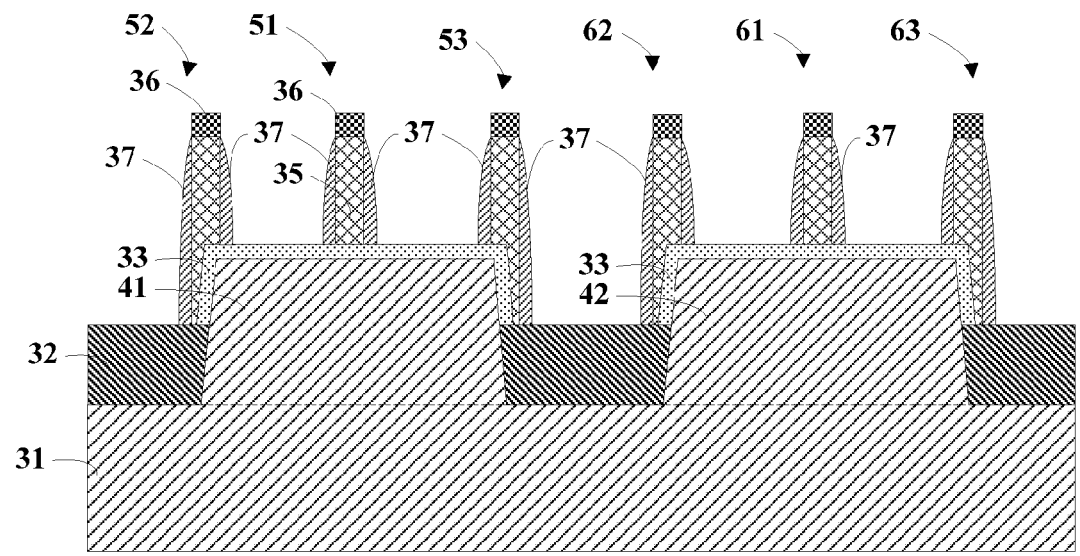
FIG. 5 schematically illustrates a structural schematic diagram of a cross section in a phase of the manufacturing process for a semiconductor device.

FIG. 5 schematically illustrates a structural schematic diagram of a cross section of step S203. As shown in FIG. 5, spacers 37 are formed on the first insulator layer 32 and the second insulator layer 33 at two sides of each of the plurality of pseudo gate structures. For example, the spacers 37 are formed at two sides of the first pseudo gate structure 51, the second pseudo gate structure 52, and the third pseudo gate structure 53 on the first fin 41. For another example, the spacers 37 are formed at two sides of the first pseudo gate structure 61, the second pseudo gate structure 62, and the third pseudo gate structure 63 on the second fin 42. In some embodiments, the material of the spacers may include, for example, a silicon oxide or a silicon nitride.

Referring to FIG. 2, in step S204, at least one part of the second insulator layer and the fin that are not covered by the spacers and the pseudo gates are etched to form a recess.

Figure 6:
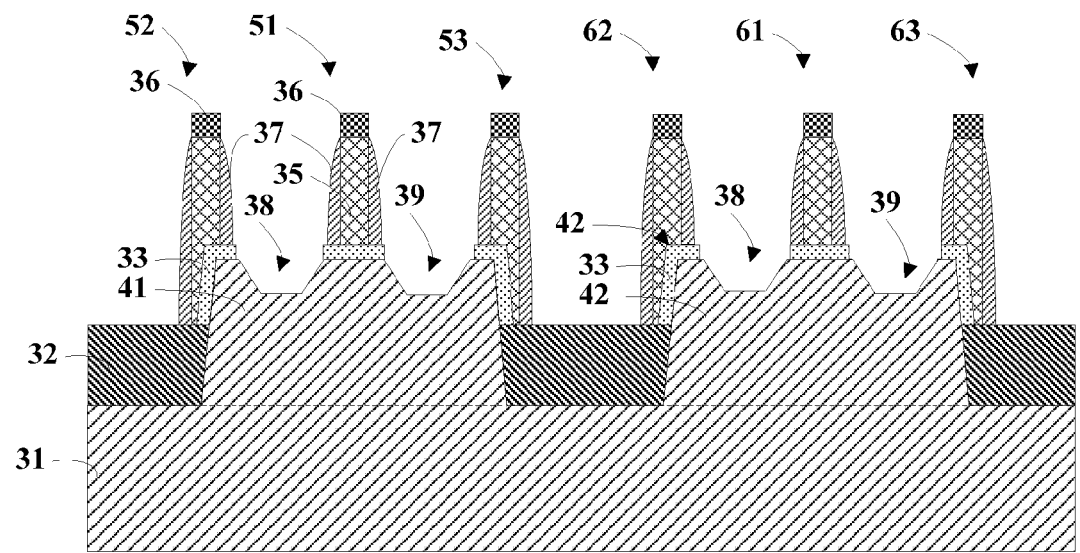
FIG. 6 schematically illustrates a structural schematic diagram of a cross section in a phase of the manufacturing process for a semiconductor device.

FIG. 6 schematically illustrates a structural schematic diagram of a cross section of step S204. For example, as shown in FIG. 6, at least one part of the second insulator layer 33 and the fin (for example, the first fin 41 or the second fin 42) that are not covered by the spacers 37 and the pseudo gates 35 is etched by using the spacers and the pseudo gates or the hard mask layer formed on the pseudo gates as an etching barrier layer through an anisotropic etching process for example, so as to form a recess (for example, a recess 38 or 39) in the fin.

In some forms, the step of forming a recess may include that: a first recess located between the first pseudo gate structure and the second pseudo gate structure and a second recess between the first pseudo gate structure and the third pseudo gate structure may be formed in the fin through the etching. For example, as shown in FIG. 6, a first recess 38 between the first pseudo gate structure 51 and the second pseudo gate structure 52 and a second recess 39 between the first pseudo gate structure 51 and the third pseudo gate structure 53 may be formed in the first fin 41 through the etching. For another example, as shown in FIG. 6, a first recess 38 between the first pseudo gate structure 61 and the second pseudo gate structure 62 and a second recess 39 between the first pseudo gate structure 61 and the third pseudo gate structure 63 may be formed in the second fin 42 through the etching.

Referring to FIG. 2, in step S205, a source or a drain is formed in the recess.

In some forms, the step may include: forming a source in the first recess and forming a drain in the second recess.

Figure 7:
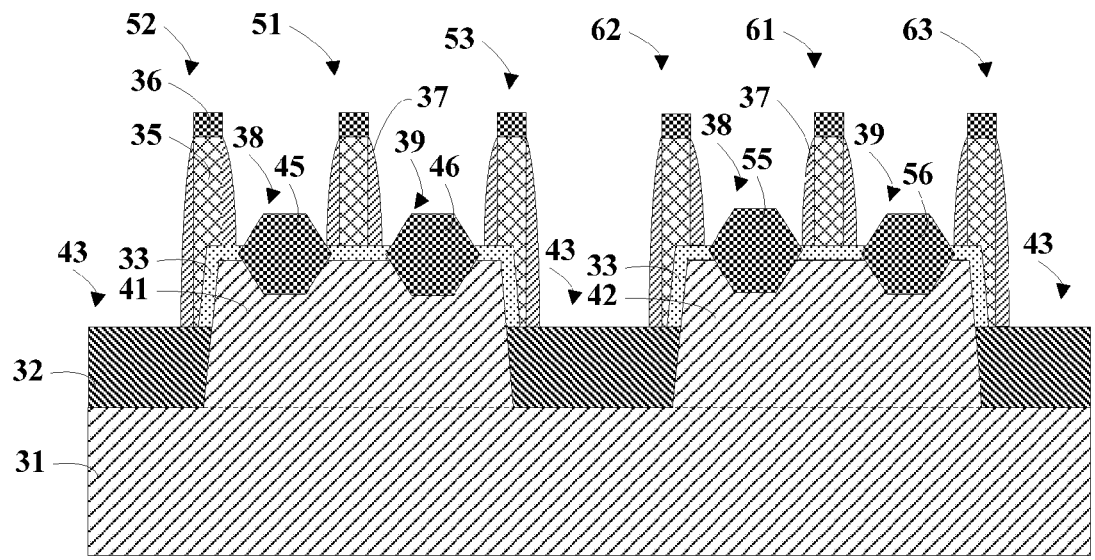
FIG. 7 schematically illustrates a structural schematic diagram of a cross section in a phase of the manufacturing process for a semiconductor device.

FIG. 7 schematically illustrates a structural schematic diagram of a cross section of step S205. For example, as shown in FIG. 7, a source 45 is formed in the first recess 38 of the first fin 41 and a drain 46 is formed in the second recess 39 of the first fin 41 through an epitaxial growth process for example. For another example, as shown in FIG. 7, a source 55 is formed in the first recess 38 of the second fin 42 and a drain 56 is formed in the second recess 39 of the second fin 42 through an epitaxial growth process for example.

In some forms of the present disclosure, the fin may be an N-well region. The material of the source or the drain may include silicon germanium (SiGe). In some forms, the one or multiple fins may all be an N-well region. Alternatively, one or some fins of the one or multiple fins are N-well regions. The respective material of the source and the drain formed on the fin of the N-well regions may include SiGe.

In some forms of the present disclosure, the fin may be a P-well region. The material of the source or the drain may include silicon carbide (SiC). In some forms, the one or multiple fins may all be a P-well region. Alternatively, one or some fins of the one or multiple fins are P-well regions. The respective material of the source and the drain formed on the fin of the P-well regions may include SiC.

In some forms of the present disclosure, the one or multiple fins may include a first fin (for example, the first fin 41) for forming a PMOS device and a second fin (for example, the second fin 42) for forming the NMOS device. The material of the source (for example, the source 45) or the drain (for example, the drain 46) on the first fin (for example, the first fin 41) may include silicon germanium. The material of the source (for example, the source 55) or the drain (for example, the drain 56) on the second fin (for example, the second fin 42) may include silicon carbide.

So far, a manufacturing method for a semiconductor device is provided. Forms of the manufacturing method of the present disclosure can prevent a source (or drain) on one fin from being undesirably connected to a source (or drain) on another fin, thereby being capable of improving reliability of the device. Forms of the manufacturing method of the present disclosure can also enable a formed source and drain to have a regular appearance, thereby being capable of improving performance of the device.

Figure 8:
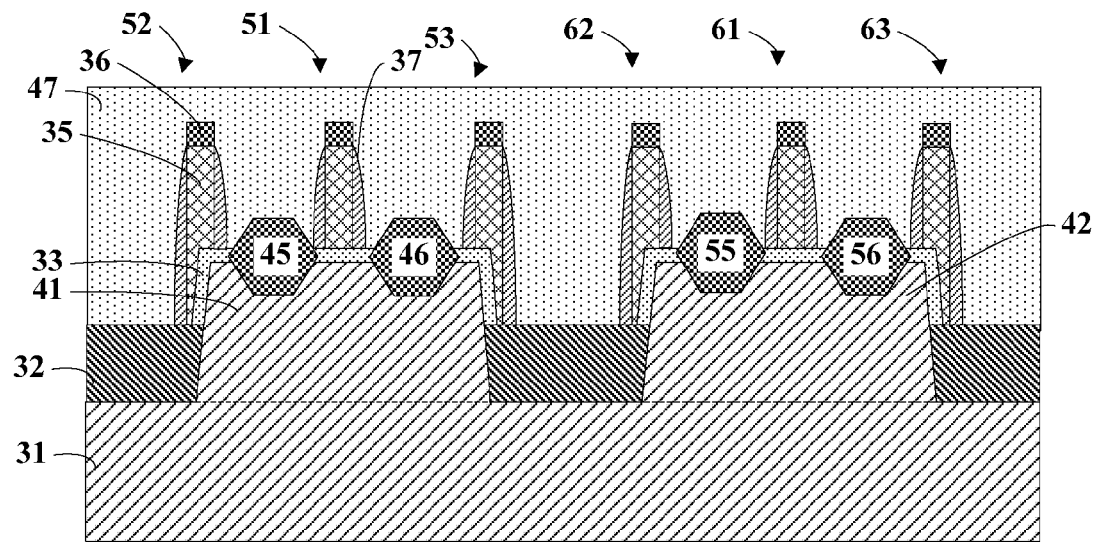
FIG. 8 schematically illustrates a structural schematic diagram of a cross section in a phase of the manufacturing process for a semiconductor device.

Optionally, the manufacturing method may further include that: as shown in FIG. 8, an interlayer dielectric layer 47 may be formed through a deposition process for example, so as to cover the substrate structure after the source or the drain is formed. For example, the material of the interlayer dielectric layer may include silicon dioxide.

Figure 9:
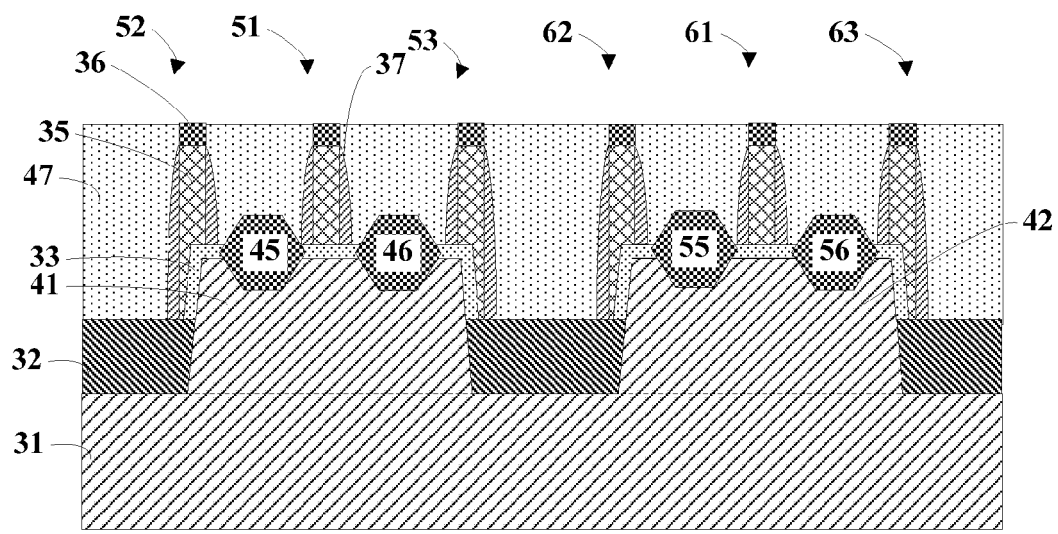
FIG. 9 schematically illustrates a structural schematic diagram of a cross section in a phase of the manufacturing process for a semiconductor device.

Optionally, the manufacturing method may further include: as shown in FIG. 9, the interlayer dielectric layer 47 is etched back, so as to expose an upper surface of the hard mask layer 36. For example, the etching back may be implemented by using a planarization (for example chemical and mechanical planarization) process.

Figure 10:
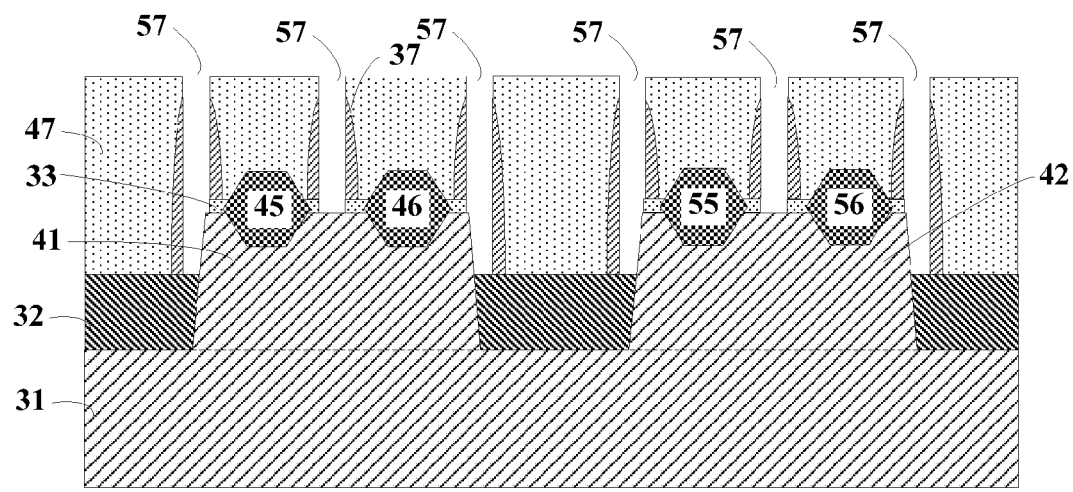
FIG. 10 schematically illustrates a structural schematic diagram of a cross section in a phase of the manufacturing process for a semiconductor device.

Optionally, the manufacturing method may further include: as shown in FIG. 10, removing the hard mask layer 36, the pseudo gate 35, and a part of the second insulator layer 33, so as to form an opening 57.

Figure 11:
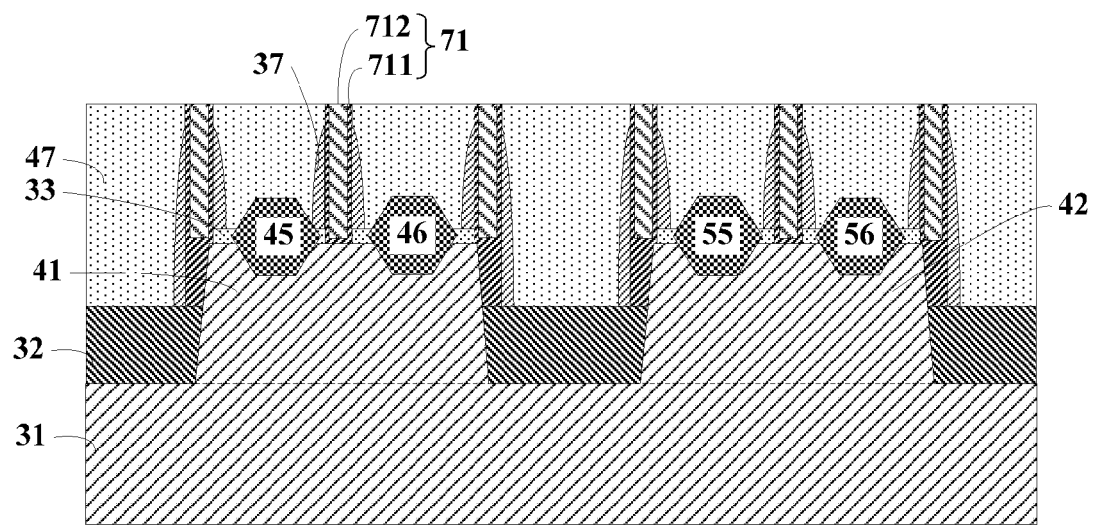
FIG. 11 schematically illustrates a structural schematic diagram of a cross section in a phase of the manufacturing process for a semiconductor device.

Optionally, the manufacturing method may further include: as shown in FIG. 11, forming a gate structure 71 in the opening 57.

In some forms, the gate structure 71 may include: a gate insulator layer 711 on the fin (for example, the first fin 41 or the second fin 42) and wrapping a part of the fin, and a gate 712 on the gate insulator layer 711. For example, the material of the gate insulator layer may include silicon dioxide or a k (dielectric constant) dielectric material. For example, the material of the gate may include metals such as tungsten or aluminum.

In some forms, the step of forming a gate structure may include: for example, forming a gate insulator layer 711 on a bottom part or a sidewall of the opening 57 through a deposition process and then depositing a gate material, so as to fill the opening 57. Optionally, planarization is performed on the gate material to form a gate 712.

So far, a manufacturing method for a semiconductor device according to some other forms of the present disclosure is provided.

FIG. 13A to FIG. 13I schematically illustrate structural schematic diagrams of cross sections in several phases of a manufacturing process for a substrate structure. The manufacturing process for a substrate structure is described below with reference to FIG. 13A to FIG. 13I.

Figure 13A:
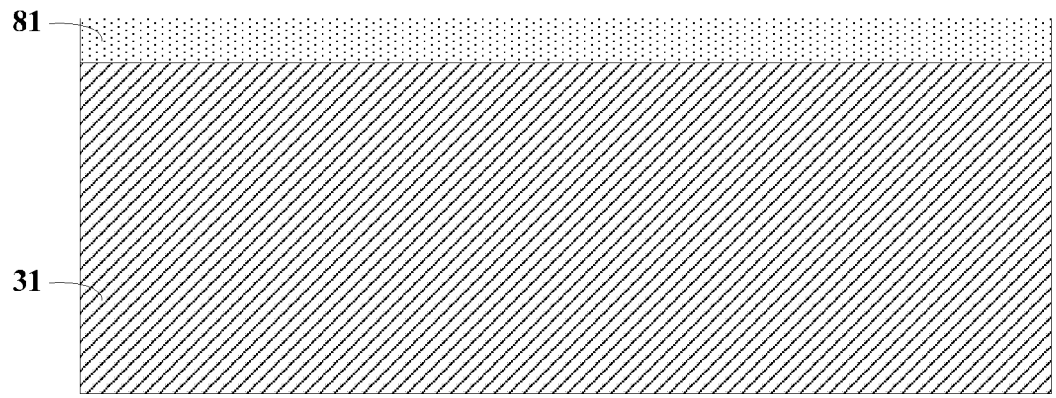
FIG. 13A schematically illustrates a structural schematic diagram of a cross section in a phase of the manufacturing process for a substrate structure.

First, as shown in FIG. 13A, a third insulator layer 81 is formed, as a buffering layer, on a semiconductor substrate (for example, a silicon substrate) 31 through a deposition or oxidation process for example. The material of the third insulator layer may include silicon dioxide, for example.

Figure 13B:
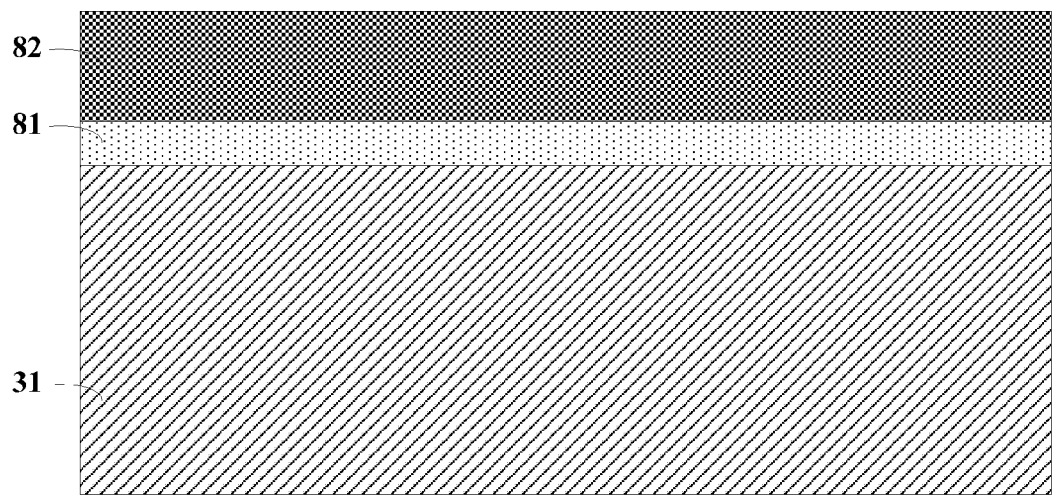
FIG. 13B schematically illustrates a structural schematic diagram of a cross section in a phase of the manufacturing process for a substrate structure.

Subsequently, as shown in FIG. 13B, a fourth insulator layer 82 is formed on the third insulator layer 81 through a deposition process for example. The material of the fourth insulator layer may include silicon nitride, for example.

Figure 13C:
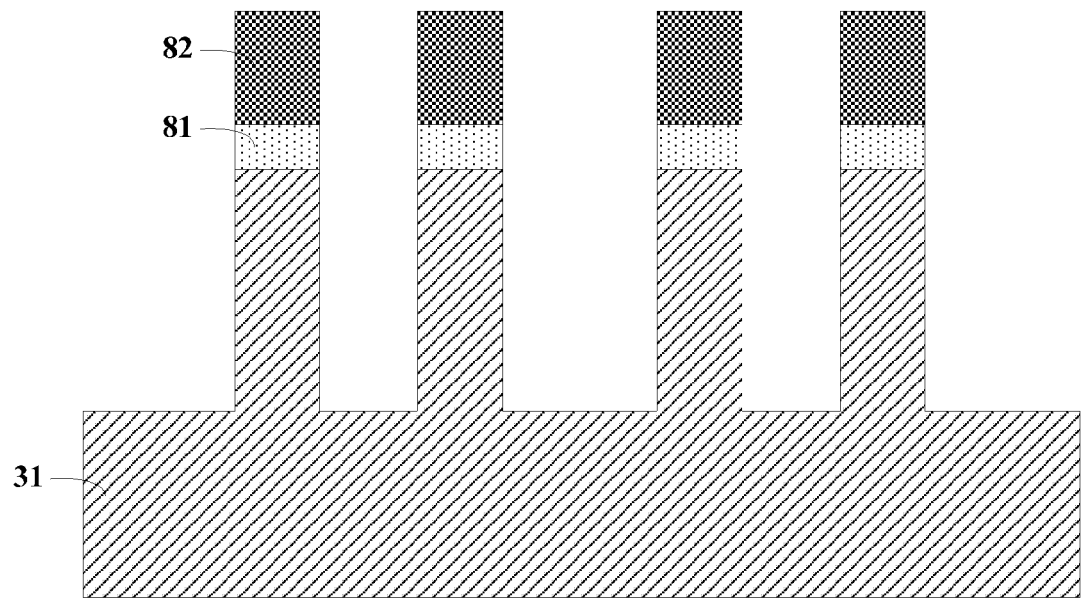
FIG. 13C schematically illustrates a structural schematic diagram of a cross section in a phase of the manufacturing process for a substrate structure.

Subsequently, as shown in FIG. 13C, the structure shown in FIG. 13B is etched so as to form fins isolated by a trench, that is, semiconductor fins. For example, a second patterned mask layer (not shown in FIG. 13C) may be coated on the structure shown in FIG. 13B, then the fourth insulator layer 82, the third insulator layer 81, and the semiconductor substrate 31 are etched by using the second mask layer, so as to form fins, and then the second mask layer is removed.

Figure 13D:
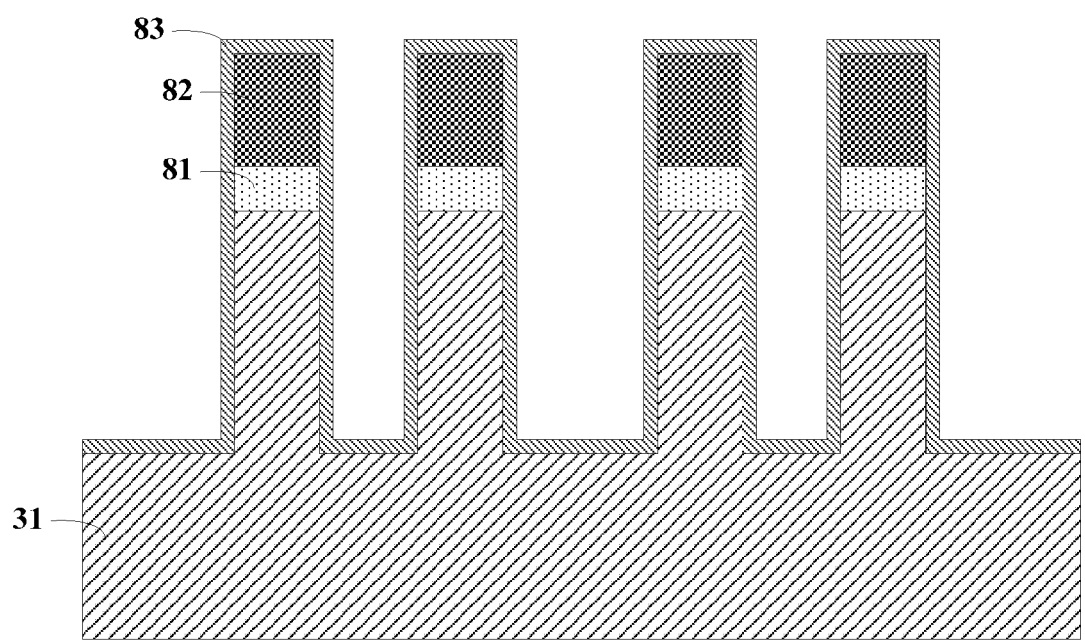
FIG. 13D schematically illustrates a structural schematic diagram of a cross section in a phase of the manufacturing process for a substrate structure.

Subsequently, as shown in FIG. 13D, a fifth insulator layer 83 is formed on a surface of the structure shown in FIG. 13C through a deposition process for example. The material of the fifth insulator layer may include silicon dioxide, for example.

Figure 13E:
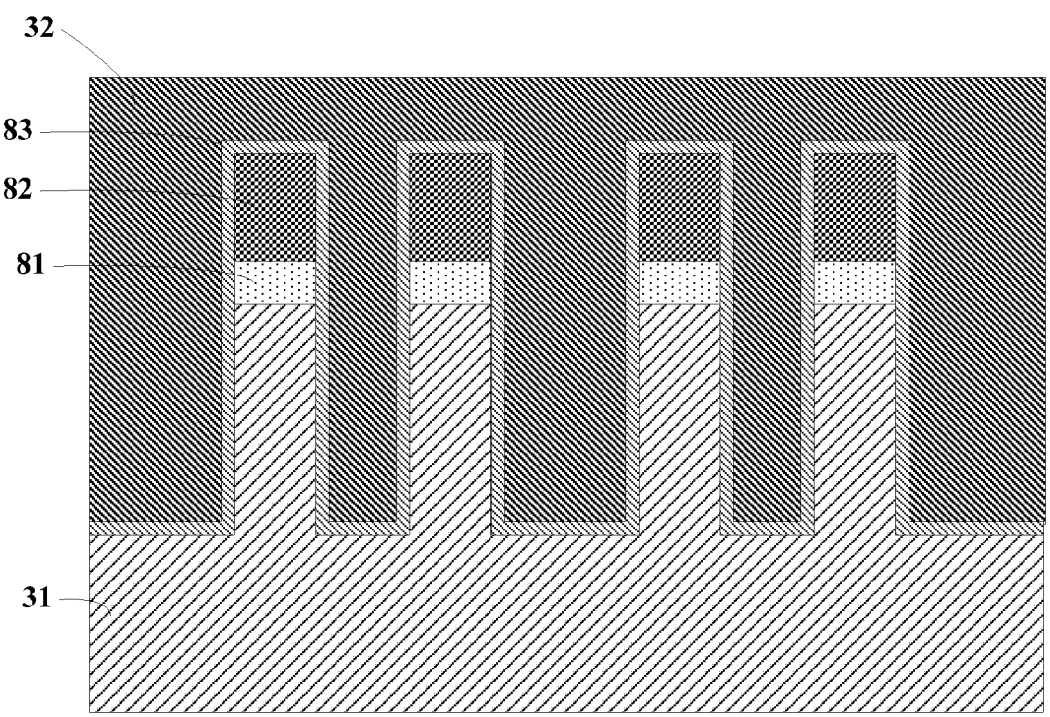
FIG. 13E schematically illustrates a structural schematic diagram of a cross section in a phase of the manufacturing process for a substrate structure.

Subsequently, as shown in FIG. 13E, a first insulator layer 32 is formed on the structure shown in FIG. 13D through a deposition process (for example, Flowable Chemical Vapor Deposition (FCVD)), so as to fill the trenches between the respective fins for example.

Figure 13F:
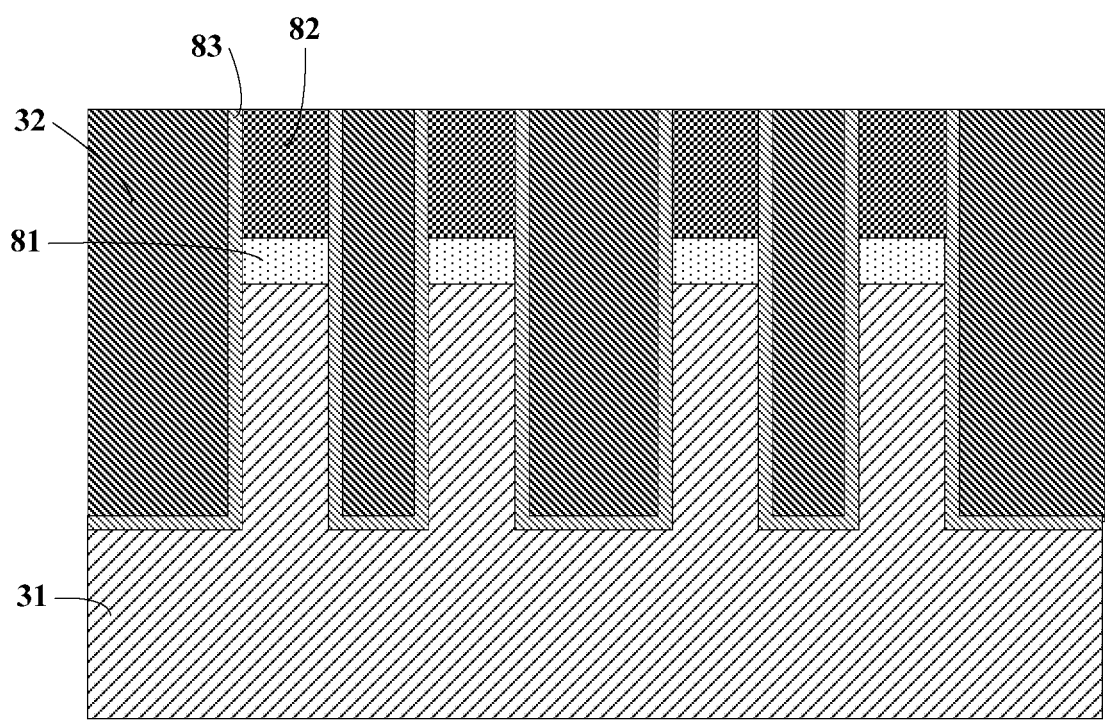
FIG. 13F schematically illustrates a structural schematic diagram of a cross section in a phase of the manufacturing process for a substrate structure.

Subsequently, as shown in FIG. 13F, the first insulator layer 32 and the fifth insulator layer 83 are planarized, so as to expose an upper surface of the fourth insulator layer 82.

Figure 13G:
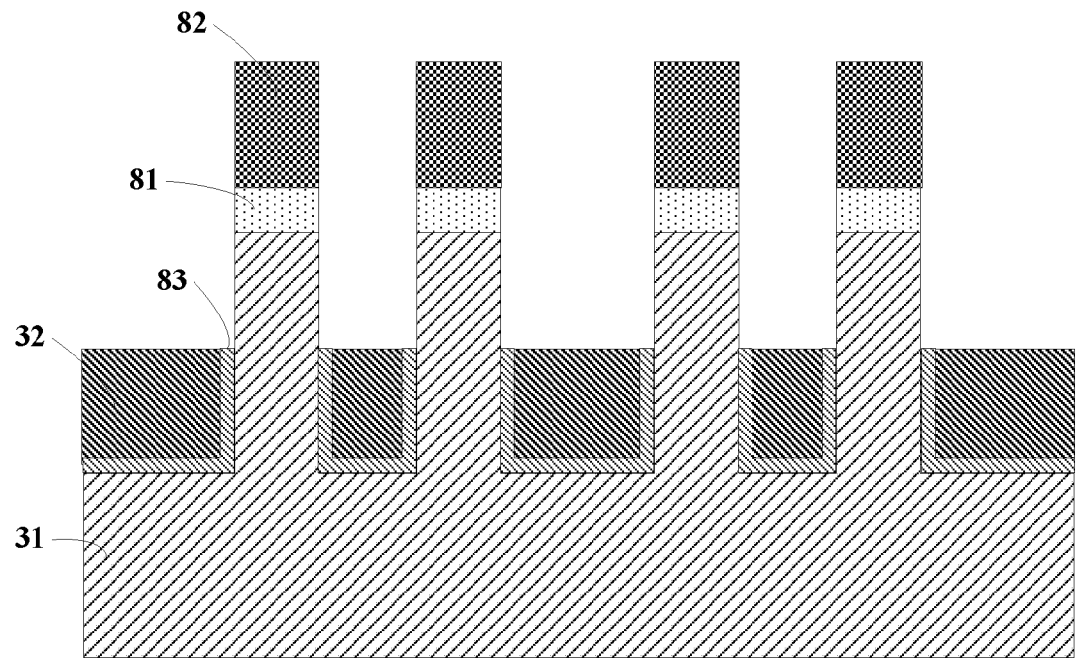
FIG. 13G schematically illustrates a structural schematic diagram of a cross section in a phase of the manufacturing process for a substrate structure.

Subsequently, as shown in FIG. 13G, the first insulator layer 32 and the fifth insulator layer 83 are etched back, to enable the semiconductor fins to protrude from the first insulator layer 32.

Figure 13H:
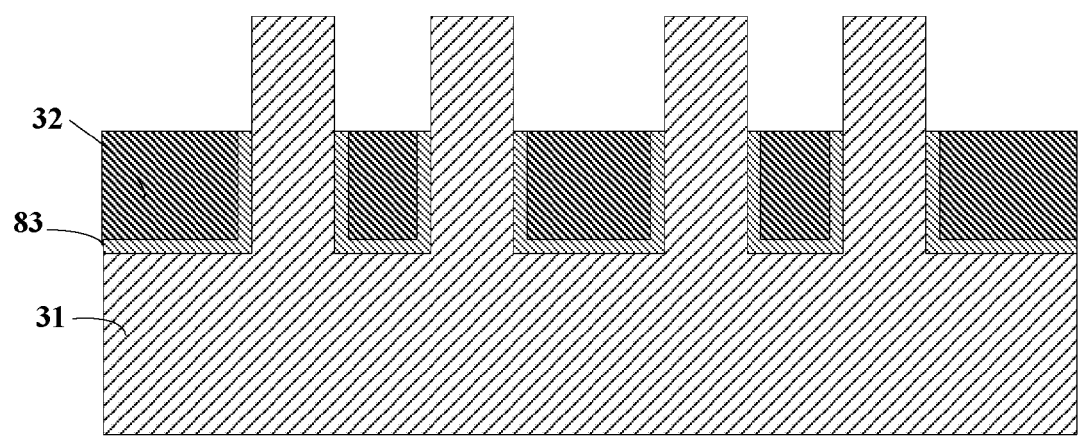
FIG. 13H schematically illustrates a structural schematic diagram of a cross section in a phase of the manufacturing process for a substrate structure.

Subsequently, as shown in FIG. 13H, the fourth insulator layer 82 and the third insulator layer 81 are removed.

Figure 13I:
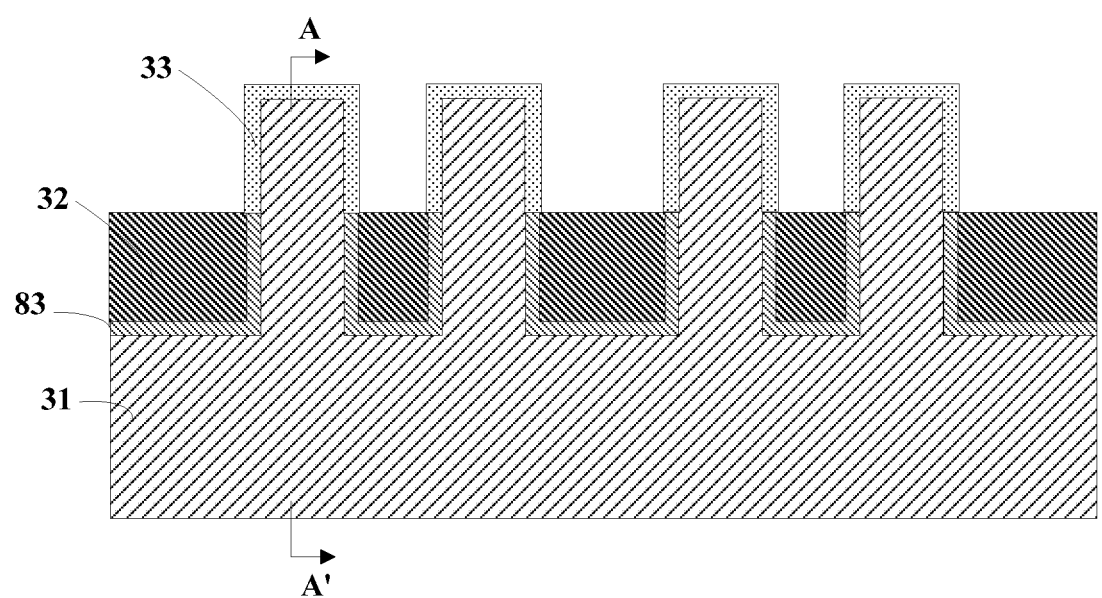
FIG. 13I schematically illustrates a structural schematic diagram of a cross section in a phase of the manufacturing process for a substrate structure.

Subsequently, as shown in FIG. 13I, a second insulator layer 33 is formed on a part of a surface of the fins through an oxidation process for example. In other forms, alternatively, the second insulator layer 33 may also be formed through a deposition process.

The schematic diagram of the substrate structure shown in FIG. 3 may be regarded as a structural schematic diagram of a cross section taken from FIG. 13I along A-A'. The fifth insulator layer 83 in FIG. 13I is omitted in FIG. 3. In some forms, the substrate structure may further include a fifth insulator layer 83 located between the first insulator layer 32 and the semiconductor substrate 31 and between the first insulator layer 32 and the fin (for example, the first fin 41 or the second fin 42). In some forms, the substrate structure also may not include the fifth insulator layer.

The present disclosure further provides a semiconductor device. For example, as shown in FIG. 7, the semiconductor device may include a semiconductor substrate 31. The semiconductor substrate may be, for example, a silicon substrate.

In some forms of the present disclosure, the semiconductor device may further include one or multiple fins protruding from the semiconductor substrate, for example, the first fin 41 and the second fin 42 shown in FIG. 7. Trench 43 are formed at sides of each fin. The fin is a semiconductor fin. For example, the material of the fin may include silicon.

In some forms of the present disclosure, the semiconductor device may further include a first insulator layer 32 partially filling the trenches 43. The fin (for example, the first fin 41 or the second fin 42) protrudes from the first insulator layer 32. The material of the first insulator layer may include silicon dioxide, for example.

In some forms of the present disclosure, the semiconductor device may further include a second insulator layer 33 covering the fin. The material of the second insulator layer may include silicon dioxide, for example.

In some forms of the present disclosure, the semiconductor device may further include a plurality of pseudo gate structures that is on the second insulator layer 33, each of which wraps a part of the fin. The pseudo gate structure may include a pseudo gate 35 located on the second insulator layer 33. The material of the pseudo gate may include polysilicon, for example. Optionally, the pseudo gate structure may further include a hard mask layer 36 located on the pseudo gate 35. The material of the hard mask layer may include silicon nitride, for example.

In some forms, the plurality of pseudo gate structures includes at least a first pseudo gate structure and a second pseudo gate structure that are spaced from each other. For example, as shown in FIG. 7, on the first fin 41, the plurality of pseudo gate structures includes at least a first pseudo gate structure 51 and a second pseudo gate structure 52 that are spaced from each other. For another example, as shown in FIG. 7, on the second fin 42, the plurality of pseudo gate structures includes at least a first pseudo gate structure 61 and a second pseudo gate structure 62 that are spaced from each other.

In some forms, the second pseudo gate structure is located at an edge corner of a fin and a part of the second pseudo gate structure is located on the first insulator layer. For example, as shown in FIG. 7, by using the pseudo gate structures on the first fin 41 as an example, the second pseudo gate structure 52 is located at an edge corner of the first fin 41 and a part of the second pseudo gate structure 52 is located on the first insulator layer 32.

In some forms, the plurality of pseudo gate structures may further include a third pseudo gate structure spaced from the first pseudo gate structure. For example, as shown in FIG. 7, on the first fin 41, the plurality of pseudo gate structures may further include a third pseudo gate structure 53 spaced from the first pseudo gate structure 51. For another example, as shown in FIG. 7, on the second fin 42, the plurality of pseudo gate structures may further include a third pseudo gate structure 63 spaced from the first pseudo gate structure 61. By using the plurality of pseudo gate structures on the first fin 41 as an example, as shown in FIG. 7, the second pseudo gate structure 52 and the third pseudo gate structure 53 are located at two sides of the first pseudo gate structure 51, respectively, the third pseudo gate structure 53 is located at an edge corner of a fin (for example, the first fin 41), and a part of the third pseudo gate structure 53 is located on the first insulator layer 32.

In some forms, the second pseudo gate structure (for example, the second pseudo gate structure 52) is spaced from the first pseudo gate structure (for example, the first pseudo gate structure 51) for a first distance. In some forms, the first distance may range from 60 nm to 100 nm, for example, 70 nm, 80 nm, or 90 nm.

In some forms, the third pseudo gate structure (for example, the third pseudo gate structure 53) is spaced from the first pseudo gate structure (for example, the first pseudo gate structure 51) for a second distance. In some forms, the second distance may range from 60 nm to 100 nm, for example, 70 nm, 80 nm, or 90 nm.

In some forms of the present disclosure, as shown in FIG. 7, the semiconductor device may further include a first insulator layer 32 and a second insulator layer 33, and spacers 37 respectively at two sides of the plurality of pseudo gate structures. For example, as shown in FIG. 7, the semiconductor device may further include spacers 37 at two sides of the respective first pseudo gate structure 51, the second pseudo gate structure 52, and the third pseudo gate structure 53 on the first fin 41. For example, as shown in FIG. 7, the semiconductor device may further include spacers 37 at two sides of the respective first pseudo gate structure 61, the second pseudo gate structure 62, and the third pseudo gate structure 63 on the second fin 42. In some forms, the material of the spacers may include, for example, a silicon oxide or a silicon nitride.

In some forms of the present disclosure, the semiconductor device may further include a source or a drain located among the plurality of pseudo gate structures located on the fin.

In some forms, the source may include a source between the first pseudo gate structure and the second pseudo gate structure. For example, as shown in FIG. 7, on the first fin 41, the source may include the source 45 located between the first pseudo gate structure 51 and the second pseudo gate structure 52. For another example, as shown in FIG. 7, on the second fin 42, the source may include the source 55 located between the first pseudo gate structure 61 and the second pseudo gate structure 62.

In some forms, the drain may include a drain between the first pseudo gate structure and the third pseudo gate structure. For example, as shown in FIG. 7, on the first fin 41, the drain may include the drain 46 located between the first pseudo gate structure 51 and the third pseudo gate structure 53. For another example, as shown in FIG. 7, on the second fin 42, the drain may include the drain 56 located between the first pseudo gate structure 61 and the third pseudo gate structure 63.

In some forms of the present disclosure, the fin may be an N-well region. The material of the source or the drain may include silicon germanium (SiGe). In some forms, the one or multiple fins may be an N-well region. Alternatively, one or some fins of the one or multiple fins are N-well regions. The respective material of the source and the drain formed on the fin of the N-well regions may include SiGe.

In some forms of the present disclosure, the fin may be a P-well region. The material of the source or the drain may include silicon carbide (SiC). In some forms, the one or multiple fins may all be a P-well region. Alternatively, one or some fins of the one or multiple fins are P-well regions. The respective material of the source and the drain on the fin of the P-well regions may include SiC.

In some forms of the present disclosure, the one or multiple fins may include a first fin (for example, the first fin 41) for forming a PMOS device and a second fin (for example, the second fin 42) for forming the NMOS device. The material of the source (for example, the source 45) or the drain (for example, the drain 46) on the first fin (for example, the first fin 41) may include silicon germanium. The material of the source (for example, the source 55) or the drain (for example, the drain 56) on the second fin (for example, the second fin 42) may include silicon carbide.

Forms of the semiconductor device of the present disclosure can prevent a source (or drain) on one fin from being undesirably connected to a source (or drain) on another fin, thereby being capable of improving reliability of the device. Forms of the semiconductor device of the present disclosure can also enable a formed source and drain to have a regular appearance, thereby being capable of improving performance of the device.

Forms of a method for manufacturing a semiconductor device of the present disclosure and a semiconductor device formed thereby have been described above in detail. To avoid shielding of concepts of the present disclosure, some well-known details in this field are not described. A person skilled in the art would fully understand how to implement the technical solution disclosed herein according to the above description.

Although some specific forms of the present disclosure are described in detail through examples, a person skilled in the art should understand that the above examples are used for illustration only, rather than be used for limiting the scope of protection of the present invention. A person skilled in the art should understand that amendments can be made to the forms without departing from the scope and the spirit of the present invention. The scope of the present invention is limited by the attached claims.

What is claimed is:
1. A manufacturing method for a semiconductor device, comprising:
   providing a substrate structure, wherein the substrate structure comprises:
   a semiconductor substrate;
   a single fin protruding from the semiconductor substrate, wherein trenches are formed on sides of the fin;
   a pad insulator layer for padding the trenches;

a first insulator layer separately formed from the pad insulator layer and partially filling the trenches, wherein the single fin protrudes from the first insulator layer; and a second insulator layer covering the single fin;

forming a plurality of pseudo gate structures on the second insulator layer, wherein each pseudo gate structure wraps a part of the single fin, wherein each pseudo gate structure comprises a pseudo gate located on the second insulator layer, wherein the plurality of pseudo gate structures comprises at least a first pseudo gate structure, a second pseudo gate structure, and a third pseudo gate structure that are spaced from each other, and wherein the second pseudo gate structure and the third pseudo gate structure are located at two opposite edge corners of the single fin and the first pseudo gate structure is a only pseudo gate structure disposed between the second pseudo gate structure and the third pseudo gate structure, and a first part of each of the second pseudo gate structure and the third pseudo gate is on and in direct contact with the first insulator layer and a second part of each of the second pseudo gate structure and the third pseudo gate structure is on and in direct contact with the second insulator layer;

forming, above the first insulator layer and the second insulator layer, spacers at two sides of each of the second pseudo gate structure and the third pseudo gate structure, where a bottom face of one of the spacers for each of the second pseudo gate structure and the third pseudo gate structure is in direct contact with the first insulator layer whereas a bottom face of another of the spacers for each of the second pseudo gate structure and the third pseudo gate structure is in direct contact with the second insulator layer;

etching, after forming the spacers, the second insulator layer and at least a part of the single fin that are not covered by the spacers and the pseudo gates, to form recesses in the single fin; and forming at least one source or drain in the recesses.

2. The manufacturing method for a semiconductor device according to claim 1, wherein the step of forming recesses comprises:

forming, in the single fin, a first recess located between the first pseudo gate structure and the second pseudo gate structure and forming a second recess located between the first pseudo gate structure and the third pseudo gate structure through etching.

3. The manufacturing method for a semiconductor device according to claim 2, wherein the step of forming at least one source or drain in the recess comprises:

forming a source in the first recess and forming a drain in the second recess.

4. The manufacturing method for a semiconductor device according to claim 1, wherein material of the pseudo gates comprises polysilicon.

5. The manufacturing method for a semiconductor device according to claim 1, further comprising forming a hard mask layer on each of the pseudo gate structures, wherein material of the hard mask layer comprises silicon nitride.

6. The manufacturing method for a semiconductor device according to claim 1, wherein the second pseudo gate structure is spaced from the first pseudo gate structure for a first distance, wherein the first distance ranges from 60 nm to 100 nm.

7. The manufacturing method for a semiconductor device according to claim 1, wherein the third pseudo gate structure is spaced from the first pseudo gate structure for a second distance, wherein the second distance ranges from 60 nm to 100 nm.

8. The manufacturing method for a semiconductor device according to claim 5, further comprising:

forming an interlayer dielectric layer to cover the substrate structure after the source or the drain is formed;

etching back the interlayer dielectric layer, to expose an upper surface of the hard mask layer;

removing the hard mask layer, the pseudo gates, and a part of the second insulator layer, so as to form openings; and forming gate structures in the opening.

9. The manufacturing method for a semiconductor device according to claim 8, wherein each of the gate structures comprises:

a gate insulator layer that is on the single fin and wraps a part of the single fin, and a gate on the gate insulator layer.

10. The manufacturing method for a semiconductor device according to claim 1, wherein the single fin is an N-well region, and material of the at least one source or the drain comprises silicon germanium; or the single fin is a P-well region, and material of the at least one source or the drain comprises silicon carbide.

11. The manufacturing method for a semiconductor device according to claim 1, wherein the semiconductor substrate comprises two single fins, with a first single fin for forming a PMOS device and a second single fin for forming an NMOS device, and wherein material of the at least one source or the drain on the first single fin comprises silicon germanium; and material of the at least one source or the drain on the second single fin comprises silicon carbide.

12. A semiconductor device, comprising:

a semiconductor substrate;

a single fin protruding from the semiconductor substrate, wherein trenches are formed on sides of the single fin;

a pad insulator layer for padding the trenches;

a first insulator layer separately formed from the pad insulator layer and partially filling the trenches, wherein the single fin protrudes from the first insulator layer;

a second insulator layer covering the single fin;

a plurality of pseudo gate structures on the second insulator layer, wherein each pseudo gate structure wraps a part of the single fin, wherein each pseudo gate structure comprises a pseudo gate located on the second insulator layer, wherein the plurality of pseudo gate structures comprises at least a first pseudo gate structure, a second pseudo gate structure, and a third pseudo gate structure that are spaced from each other, and wherein the second pseudo gate structure and the third pseudo gate structure are located at two opposite edge corners of the single fin and the first pseudo gate structure is a only pseudo gate structure disposed between the second pseudo gate structure and the third pseudo gate structure, and a first part of each of the second pseudo gate structure and the third pseudo gate is on and in direct contact with the first insulator layer and a second part of each of the second pseudo gate structure and the third pseudo gate structure is on and in direct contact with the second insulator layer;

spacers at two sides of each of the second pseudo gate structure and the third pseudo gate structure, where a bottom face of one of the spacers for each of the second pseudo gate structure and the third pseudo gate structure is in direct contact with the first insulator layer whereas a bottom face of another of the spacers for each of the second pseudo gate structure and the third pseudo gate structure is in direct contact with the second insulator layer; and at least one source or drain on the single fin and located among the plurality of pseudo gate structures.

13. The semiconductor device according to claim 12, wherein material of the pseudo gates comprises polysilicon.

14. The semiconductor device according to claim 12, further comprising a hard mask layer on each of the pseudo gate structures wherein material of the hard mask layer comprises silicon nitride.

15. The semiconductor device according to claim 12, wherein the second pseudo gate structure is spaced from the first pseudo gate structure for a first distance, wherein the first distance ranges from 60 nm to 100 nm.

16. The semiconductor device according to claim 12, wherein the third pseudo gate structure is spaced from the first pseudo gate structure for a second distance, wherein the second distance ranges from 60 nm to 100 nm.

17. The semiconductor device according to claim 12, wherein the at least one source or drain comprises a source located between the first pseudo gate structure and the second pseudo gate structure and a drain located between the first pseudo gate structure and the third pseudo gate structure.

18. The semiconductor device according to claim 12, wherein the single fin is an N-well region, and material of the at least one source or the drain comprises silicon germanium; or the single fin is a P-well region, and material of the at least one source or the drain comprises silicon carbide.

19. The semiconductor device according to claim 12, wherein the semiconductor device comprises two single fins, with a first single fin for forming a PMOS device and a second single fin for forming an NMOS device, wherein material of the at least one source or the drain on the first single fin comprises silicon germanium; and wherein material of the at least one source or the drain on the second single fin comprises silicon carbide.

\* \* \* \* \*